US006542383B1

(12) United States Patent
Tsuyuki et al.

(10) Patent No.: US 6,542,383 B1
(45) Date of Patent: Apr. 1, 2003

(54) SYSTEMS FOR MOUNTING ELECTRONIC COMPONENT MODULES

(75) Inventors: Brian Tsuyuki, Roseville, CA (US); Herbert J. Tanzer, Folsom, CA (US); Kwang H. Kim, Santa Clara, CA (US); Tanya Schneider, San Jose, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/970,189

(22) Filed: Oct. 3, 2001

Related U.S. Application Data

(60) Provisional application No. 60/325,787, filed on Aug. 24, 2001.

(51) Int. Cl.[7] ................................................. H05K 9/00
(52) U.S. Cl. ....................... 361/816; 361/800; 361/818; 361/801; 361/728; 361/796; 361/803
(58) Field of Search ................................ 361/800, 816, 361/818, 752, 753, 796, 803, 728, 801

(56) References Cited

U.S. PATENT DOCUMENTS

| | | | |
|---|---|---|---|
| 3,697,084 A | 10/1972 | Ban | 274/4 F |
| 3,959,823 A | 5/1976 | Heidecker et al. | 360/99 |
| 3,964,098 A | 6/1976 | Kramer et al. | 360/93 |
| 4,062,049 A | 12/1977 | Dirks | 360/78 |
| 4,194,224 A | 3/1980 | Grapes et al. | 360/97 |
| 4,349,850 A | 9/1982 | Harvey | 360/74.2 |
| 4,359,762 A | 11/1982 | Stollorz | 360/98 |
| 4,413,328 A | 11/1983 | Videki, II | 364/900 |
| 4,633,350 A | 12/1986 | Hanson | 360/98 |
| 4,912,580 A | 3/1990 | Hanson | 360/98.01 |
| 5,122,914 A | 6/1992 | Hanson | 360/98.01 |
| 5,162,980 A * | 11/1992 | Morgan et al. | 174/35 GC |
| 5,323,298 A * | 6/1994 | Shatas et al. | 174/35 R |
| 5,327,308 A | 7/1994 | Hanson | 360/97.01 |
| 5,515,215 A | 5/1996 | Hanson | 360/98.01 |
| 5,517,373 A | 5/1996 | Hanson | 360/98.01 |
| 5,563,748 A | 10/1996 | Hanson | 360/97.01 |
| 5,602,696 A | 2/1997 | Hanson | 360/97.01 |
| 5,682,277 A | 10/1997 | Hanson | 360/97.01 |
| 5,764,434 A | 6/1998 | Hanson | 360/97.01 |
| 5,883,757 A | 3/1999 | Hanson | 360/97.01 |
| 6,091,571 A | 7/2000 | Hanson | 360/98.04 |
| 6,095,862 A * | 8/2000 | Doye et al. | 439/607 |
| 6,097,567 A | 8/2000 | Hanson | 360/97.01 |
| 6,188,576 B1 * | 2/2001 | Ali et al. | 174/17 R |
| 6,359,768 B1 * | 3/2002 | Eversley et al. | 361/212 |

FOREIGN PATENT DOCUMENTS

| | | |
|---|---|---|
| DE | 808848 | 2/1956 |
| JP | 50-97454 | 8/1975 |
| JP | 57-94687 | 12/1980 |

OTHER PUBLICATIONS

Photographs (copies): 1) Compaq ProLiant; 2) Dell PowerEdge; 3) HP NetServer; 4) IBM Netfinity 1"; 5) IBM Netfinity 1.6" 6) Sun Ultra Enterprises; 7) HP Disk Array 1994; 8) Trimm Technology 1997; 9) Xyratex Salient Drive Carrier 1997; 10) Symbios 1998; 11) HP Disk Array 1995; 12) DEC Storage Works 1994; 13) HP NetServer LX Pro 1998; 9 pps.

(List continued on next page.)

Primary Examiner—David Martin
Assistant Examiner—Thanh Y. Tran

(57) ABSTRACT

Systems for mounting electronic components are provided. An exemplary system includes a module that is configured to mount to a chassis at a first pitch. The module incorporates a housing, which is adapted to at least partially encase an electronic component, and spring fingers that are arranged at least partially about an exterior of the housing. The spring fingers are configured to deflect in response to a displacement force so that the module can be mounted to a chassis. The module can be mounted to a first chassis that accommodates a predetermined pitch of modules. In some embodiments, the module also can be mounted at a different pitch. Other systems also are provided.

15 Claims, 10 Drawing Sheets

OTHER PUBLICATIONS

Photograph (copy): Dataflux Rugged Winchester, 5800R "Twinchesters", Signal, Oct. 1982, p. 102.

"Hard Facts About The ROLM Military Hard Disk," Defense Electronics, Oct. 1952, p. 32.

Dataflux disc drives make the grade. Again; Signal, Oct. 1982, p. 102.

Micro–Winchester subsystem in Multibus–compatible, Mini–MicroWorld; Mini–Micro Systems, Jun. 1981, p. 33.

Mil–Spec, From The Ground Up; Signal, Oct., 1982, 3 pps.

Only Miltope flexible disk drives meet the tough standards of the toughest business of them all; Defense Electronics, Mar. 1981, p. 41.

Calendar, Defense Electronics, Dec. 1962, pp. 51–52.

ASF Pluggable Design, F. Dibble, W.L. Jaskiewicz, W.C. Miller and R.E. Weber; IBM Technical Disclosure Bulletin, vol. 24, No. 1A, Jun. 1981, IBM Corp. 1981, p. 28.

Low–Cost, Rack–Mounted, Direct–Access Disk Storage Device, W.P. Bakkan, R.C. Lentz, F.C. Pexton and J.R. Reidenbach, IBM Technical Disclosure Bulletin, vol. 19, No. 10, Mar. 1977, IBM Corp. 1977.

U.S. Patent Application Ser. No. 09/809,409 (10012052–1, 50918–1490), entitled "Systems with Enhanced Electrostatic Discharge Protection," filed on Mar. 15, 2001.

* cited by examiner

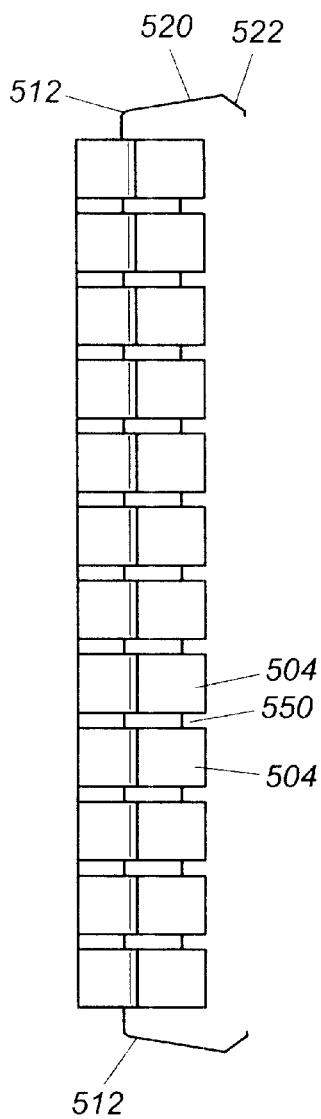 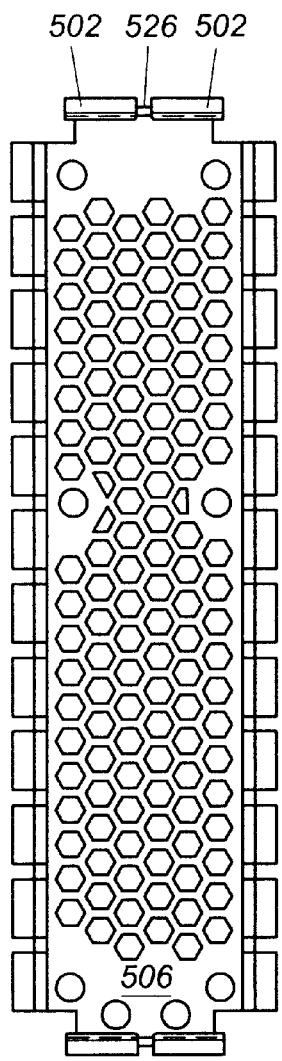
FIG. 6  FIG. 7
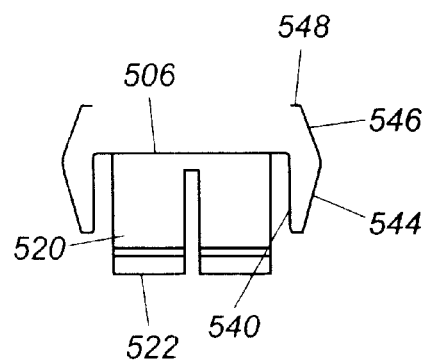
FIG. 8

SYSTEMS FOR MOUNTING ELECTRONIC COMPONENT MODULES

CROSS-REFERENCE TO RELATED APPLICATION

This application claims priority to co-pending U.S. Provisional Application entitled, "Systems for Mounting Electronic Component Modules," Ser. No. 60/325,787, filed Aug. 24, 2001, which is hereby incorporated by reference in its entirety.

BACKGROUND OF THE INVENTION

1. Field of the Invention

The present invention generally relates to electronic components. More specifically, the invention relates to electronic component modules, which incorporate spring fingers, and associated systems.

2. Description of the Related Art

Numerous electronic component modules, such as data storage medium carriers, for example, exist in the electronics industry. Typically, each of these modules is configured to mount to a particular chassis configuration. Each chassis configuration usually is configured to accommodate a particular pitch of modules, i.e., the distance from a centerline of one module to the centerline of an adjacent module.

By way of example, a particular data storage medium carrier, e.g., a disk drive carrier, could be adapted to mount an associated disk drive to a particular enclosure. That enclosure could be configured as a server product, for example. Such a server product typically is configured to mount the carrier at a particular pitch, such as a pitch of five (5) inches, for example. However, the carrier typically is unable to mount to various other configurations of enclosures, such as enclosures that accommodate various other pitches of mounted modules.

Therefore, there is a need for improved devices and systems that address these and/or other shortcomings of the prior art.

SUMMARY OF THE INVENTION

Briefly described, the present invention relates to systems for mounting electronic components. In this regard, an embodiment of the invention includes a module that is configured to mount to a chassis at a first pitch. The module incorporates a housing, which is adapted to at least partially encase an electronic component, and spring fingers that are arranged at least partially about an exterior of the housing. The spring fingers are configured to deflect in response to a displacement force so that the module can be mounted to a chassis. The module can be mounted to a first chassis that accommodates a predetermined pitch of modules. In some embodiments, the module also can be mounted at a different pitch.

Other systems of the invention include a chassis, a first module and a second module. The first module includes a housing and spring fingers and is configured to mount to the chassis at a first pitch. The second module includes a housing and spring fingers and also is configured to mount to the chassis at the first pitch. So configured, when the first module and the second module are mounted to the chassis adjacent to each other, some of the spring fingers of the modules electrically engage each other so that the modules are commonly grounded.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

FIG. 6 is a side view of the shield of FIG. 5.

FIG. 7 is a front view of the shield of FIGS. 5 and 6.

FIG. 8 is a top view of the shield of FIGS. 6–7.

DETAILED DESCRIPTION

Figure 1B:
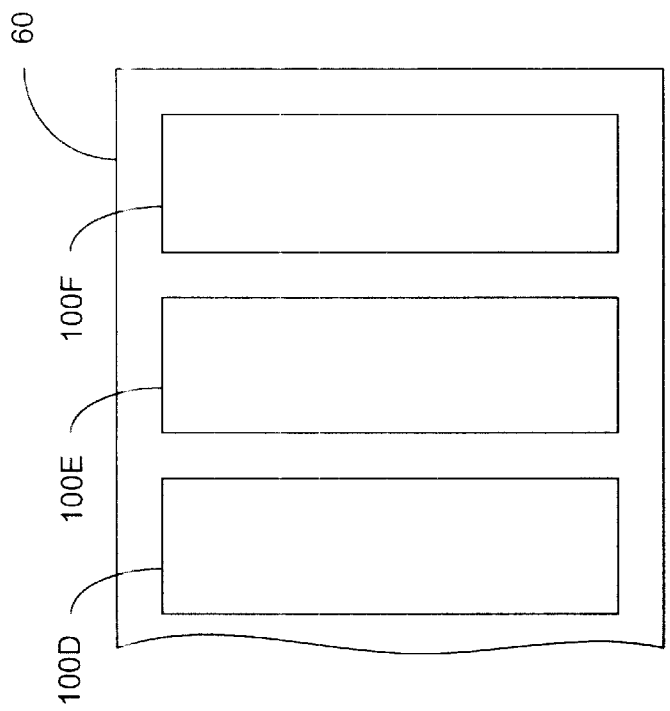
FIG. 1B is a schematic diagram depicting representative electronic component modules of the present invention mounted to a representative chassis at second module pitch.

Reference will now be made in detail to the description of the invention as illustrated in the drawings with like numerals indicating like parts throughout the several views. Schematically depicted in FIG. 1A is a preferred embodiment of the present invention, which includes a chassis 50 and one or more modules 100, e.g., modules 100A, 100B, and 100C. Each of the modules 100 is configured to protect and/or facilitate mounting of an electronic component(s) to chassis 50. A representative example of such an electronic component is a data storage device (not shown), although various other devices can be used. As used herein, the term "data storage device" refers to any device that is capable of storing data, such as a disk drive, CD ROM, and an atomic resolution storage device, among others.

Chassis 50 can be provided in various configurations, such as an enclosure, a server product, a disk array, etc.

Regardless of the configuration utilized, chassis should be able to mount one or more modules 100. When mounting more than one module, such as depicted in FIG. 1A, chassis 50 mounts the modules at a predetermined pitch, i.e., the distance from a centerline of one module to the centerline of an adjacent module. Thus, the particular pitch accommodated by the chassis depends, at least in part, upon the dimensions of the modules as well as spacing required between adjacent modules.

Figure 1A:
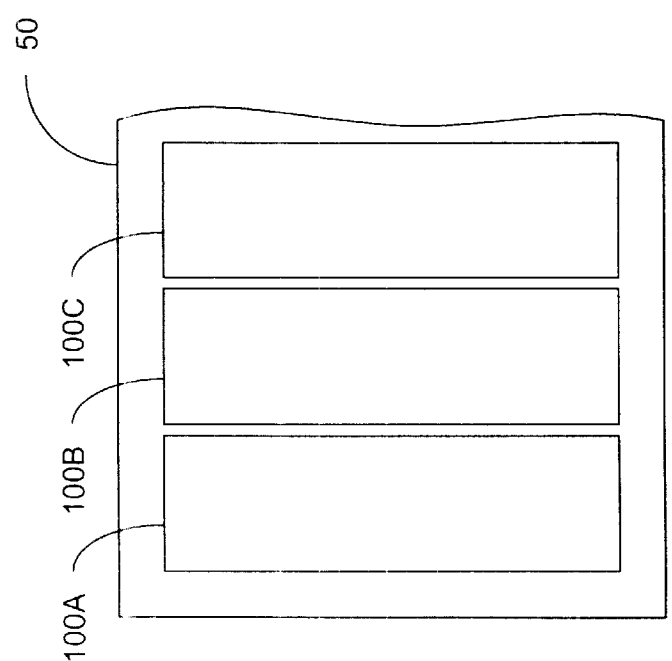
FIG. 1A is a schematic diagram depicting representative electronic component modules of the present invention mounted to a representative chassis at a first module pitch.

As shown in FIG. 1B, chassis 60 mounts modules 100, e.g., modules 100D, 100E, and 100F, at a larger pitch than that provided by chassis 50 of FIG. 1A. In this regard, since chassises 50 and 60 are mounting similarly configured modules, the pitch at which the modules are mounted to the chassis is dependent, in large part, upon the spacing requirements of the modules.

Referring to FIGS. 1A and 1B, it should be evident that modules of the invention are compatible with various pitch configurations of chassises. This compatibility can be provided while facilitating electromagnetic compatibility (EMC) of the module-chassis assembly. As is known, EMC usually requires sealing gaps and grounding at the interface(s) formed between a chassis and its modules.

Figure 2:
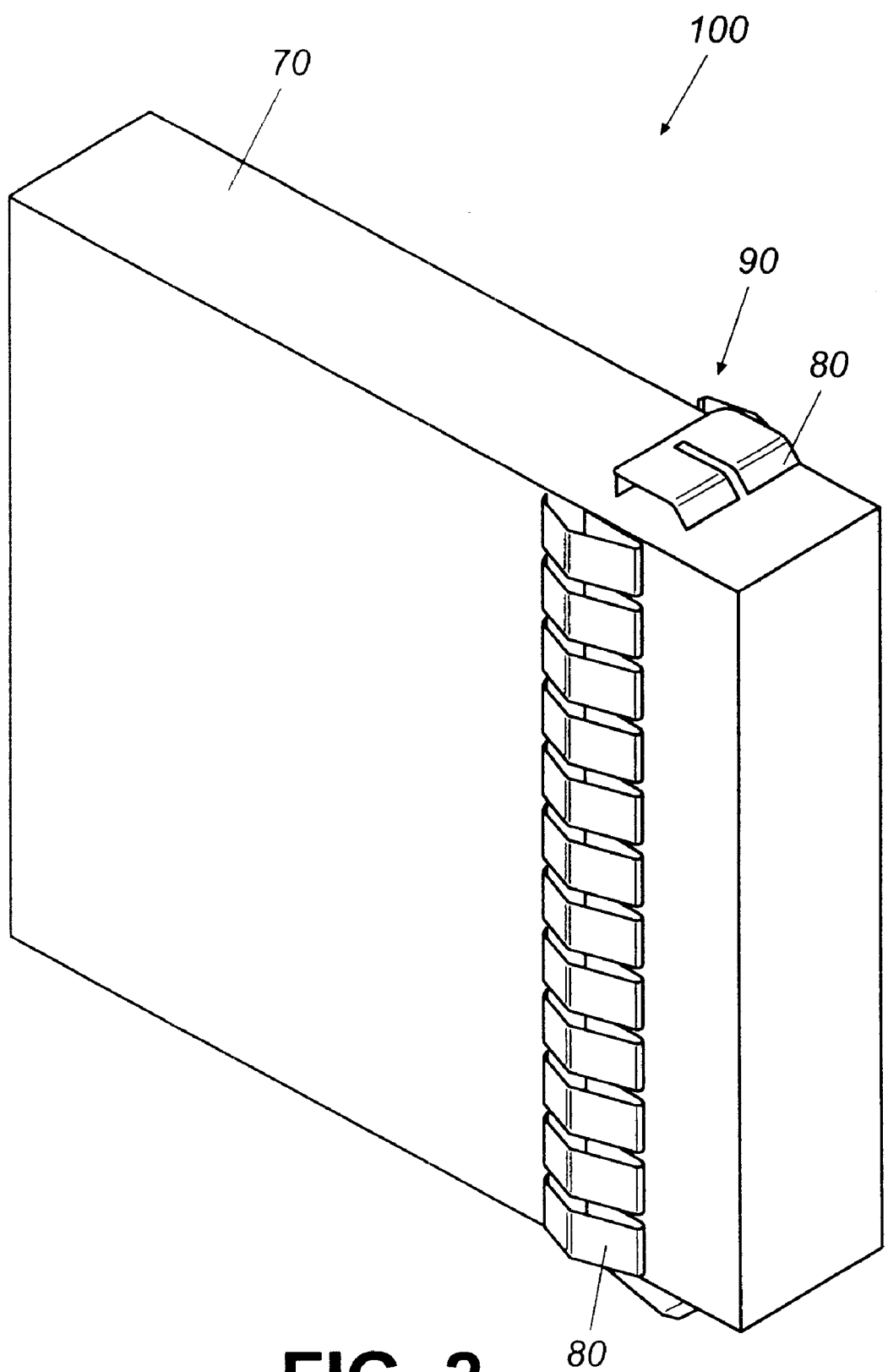
FIG. 2 is a schematic diagram depicting an embodiment of the module of FIG. 1.

In FIG. 2, an embodiment of module 100, which can be configured to provide EMC, is depicted. As shown in FIG. 2, module 100 includes a housing 70 that is adapted to at least partially encase an electronic component(s) (not shown). At least a portion of housing 70 is adapted to be received within a corresponding portion, e.g., a cage slot, of a chassis. Extending outwardly from at least a portion of the exterior of the housing are spring fingers 80. Each of the spring fingers is configured to at least partially seal a gap(s) and/or otherwise provide EMC of the module-chassis assembly. Thus, in FIG. 2, spring fingers 80 are provided substantially about a perimeter 90 of housing 70 and are designed to engage the material of the chassis defining the slot into which the module is to be received. Additionally, preferred embodiments of the spring fingers can be configured to attenuate EMI, such as for high-speed data communications hardware, for example, over a range of slot widths.

Various aspects of the spring fingers may enable hot-swapping of a module with a chassis, i.e., inserting and/or removing the carrier from the slot while power is operatively applied, without creating excessive push-pull forces on components of the chassis and/or module. This can be achieved while providing adequate electrical grounding force. Additionally, embodiments of the spring fingers do not tend to snag on adjacent modules and/or on surfaces of the chassis during hot-swapping. As described in greater detail hereinafter, the invention accommodates one or more of these features by providing compliant spring fingers that potentially enable the module to mount to different chassis configurations.

Figure 3:
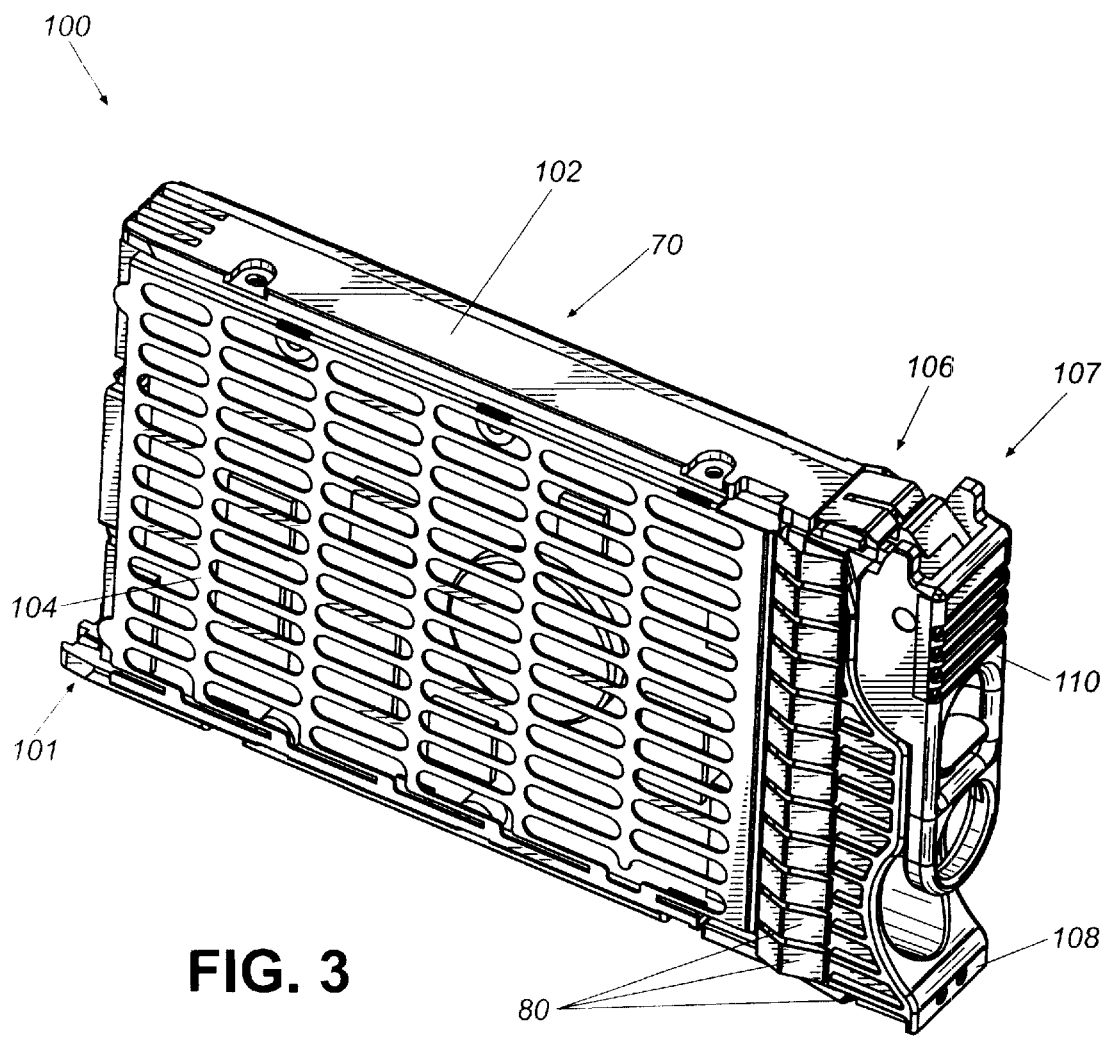
FIG. 3 is a perspective view of an embodiment of the module of FIG. 1.

A representative embodiment of the module or carrier 100 is depicted in FIG. 3. In FIG. 3, carrier 100 includes a housing 70, which incorporates a carrier frame 102 and a protective circuit assembly (PCA) cover 104. Frame 102 is sized and shaped for receiving and mounting a data storage device. At least partial encasement of the data storage device within carrier 100 is facilitated by PCA cover 104. PCA cover 104 is adapted to mate with the carrier frame 102. Once so mated, carrier frame 102, PCA cover 104, and a corresponding data storage device cooperate so as to provide a protective enclosure for more sensitive components of the data storage device, such as storage device circuit assembly (not shown). For example, and not for the purpose of limitation, the storage device circuit assembly may be positioned between the PCA cover 104 and an opposing exterior surface of the data storage device.

In addition to providing a protective enclosure for at least a portion of an associated data storage device, in some embodiments, PCA cover 104 can function as a heat sink for the data storage device. In these embodiments, the PCA cover can be formed of a material such as aluminum, for example.

In FIG. 3, carrier 100 includes an EMI shield 106, and a handle assembly 107, which incorporates a carrier bezel 108 and a handle 110. In some embodiments, handle 110 provides the dual functionality of serving as a carrying handle, which may be utilized for repositioning the carrier, and a locking mechanism for facilitating secure mounting of the carrier to an appropriate chassis or other mounting device. Preferably, spring fingers 80 are integrally formed with the EMI shield.

Some embodiments of carrier 100 are provided in a "right-handed" configuration. As utilized herein, the term "right-handed configuration" refers to a carrier configuration that enables a user to conveniently grasp handle 110 with his right hand. This configuration typically is consistent with preferred user-handling. In regard to carrier 100, the right-handed configuration typically includes providing a bezel opening 202, which is adapted to receive the thumb of the user's right hand, and an opening 204 of the handle, which is adapted to receive another finger of the user's right hand, e.g., an index finger. Preferably, opening 204 is oriented to the right of the bezel opening when the carrier 100 is in a horizontal position, e.g., PCA cover 104 is in a substantially horizontal plane and is disposed at the bottom side of the carrier.

Figure 4:
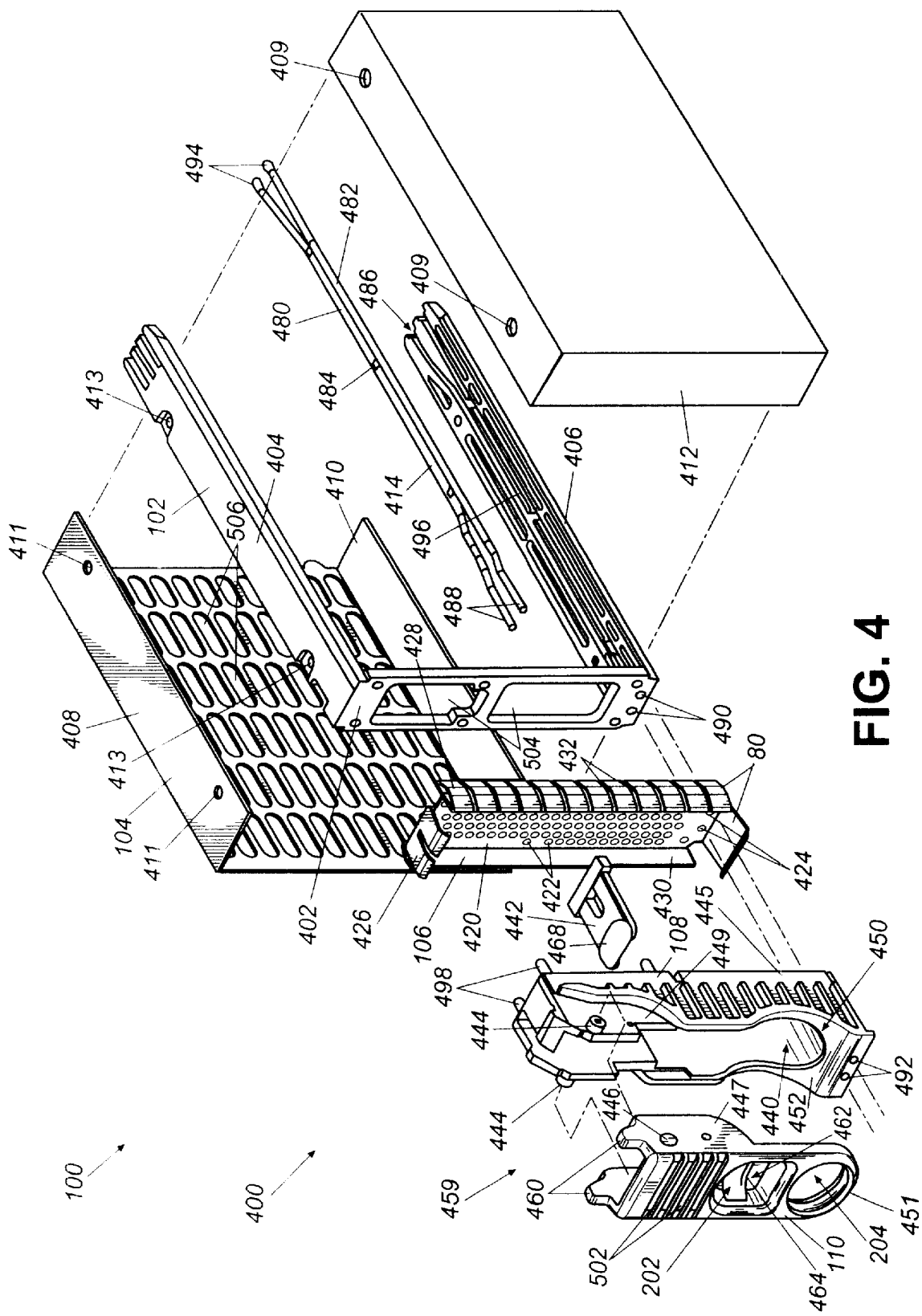
FIG. 4 is a partially-exploded, perspective view of the embodiment depicted in FIG. 3.

Reference will now be made to FIG. 4 which depicts preferred assembly detail of the embodiment of the carrier 100 depicted in FIG. 3. As shown in FIG. 4, carrier 100 includes frame 102, PCA cover 104, EMI shield 106, bezel 108, and cam handle 110. Frame 102 incorporates a face plate 402 and rails 404 and 406, which extend outwardly from face plate 402. Frame 102 is configured to receive PCA cover 104. By way of example, in the embodiment depicted in FIG. 4, sidewalls 408 and 410 of PCA cover 104 engage between rails 404 and 406, respectively, of frame 102. Sidewalls 408 and 410 are appropriately spaced to receive a data storage device, e.g., a disk drive 412. Thus, the data storage device is received at least partially between sidewalls 408 and 410.

Data storage device 412 and PCA cover 104 preferably are mounted to frame 102 by aligning mounting holes 409 of the data storage device, mounting holes 411 of PCA cover 104, and mounting holes 413 of frame 102. Mechanical fasteners (not shown) then are inserted through the aligned holes. In some embodiments, structural stability of the mounted data storage device 412 is enhanced by a snug fit of device 412 between the sidewalls of the PCA cover. Similarly, a snug fit of the sidewalls of the PCA cover between the rails of frame 102 also may enhance the structural stability of the module. The snug fit of the sidewalls of the PCA cover between the rails of the frame 102 also tends to be promoted by the mechanical fasteners, which draw the rails against the PCA cover as the fasteners are tightened.

Frame 102 is adapted to engage a lightpipe assembly 414, which will be described in detail hereinafter. Additionally, frame 102 and, more specifically, faceplate 402, is adapted to engage EMI shield 106. EMI shield 106 includes a body portion 420 that defines various apertures. In particular, an array of apertures 422 is provided, with the apertures 422 being sized and shaped to impede and/or prevent the propagation of electromagnetic energy from components arranged behind shield 106, e.g., data storage device 412. In some embodiments, apertures 422 each are configured with a hexagonal shape and also provide the function of enabling air to flow through the shield. This configuration tends to promote cooling of the data storage device 412. Body portion 420 also includes apertures 424 that are adapted to facilitate placement and/or viewing of lightpipe assembly 414.

In FIG. 4, EMI shield 106 includes spring fingers 80. EMI shield 106 is formed, at least partially, of an appropriate shielding material, such as stainless steel, for example. EMI shield 106 is formed of an appropriate thickness of material or, otherwise, is configured to provide suitable flexibility to one or more of the various spring fingers 80 (described in detail hereinafter).

Various numbers and configurations of spring fingers 80 may be provided. All such numbers and configurations are considered well within the scope of the invention. The spring fingers preferably provide one or more of the following functions: (1) promoting structural stability to reduce externally and/or internally generated shock and/or vibration; (2) promoting electrical grounding continuity between carrier 100 and a component(s) to which it is mounted, and/or other carriers of such a component(s); and (3) enhancing EMI and/or ESD control of the carrier.

Various aspects of enhancing EMI and/or ESD control of a carrier/chassis system are described in detail in co-pending U.S. patent application Ser. No. 09/809,409 (10012052-1, 50819-1490), entitled "Systems with Enhanced Electrostatic Discharge Protection," filed on Mar. 15, 2001. That application is commonly assigned to the Hewlett-Packard Company and is incorporated herein by reference in its entirety.

The structure and accompanying functionality of bezel 108 and cam handle 110 will now be described. As shown in FIG. 4, bezel 108 defines an interior cavity 440 that is adapted to receive a thumb latch 442 (described hereinafter). Pivot bosses 444 are adapted to be received within corresponding pivot holes 446 of cam handle 110. Pivot bosses 444 preferably are provided on sidewalls 445 of the bezel, with pivot holes 446 preferably being formed through sidewalls 447 of the cam handle. Engagement of the bosses 444 within the holes 446 permits pivoting of cam handle 110 about the bosses 444 between an open or unlatched position (not shown) and a closed or latched position (see FIG. 3).

As shown in FIG. 4, each of bezel sidewalls 445 preferably incorporates a recessed portion 449 that is adapted to facilitate seating of the cam handle sidewalls 447 when the cam handle is in the latched position. In the embodiment depicted in FIG. 4, the surface defining each bezel sidewall recessed portion 449 extends to form a contoured profile of the bezel that provides appropriate clearance between the bezel and portions of the cam handle during pivoting of the cam handle.

In order to facilitate mounting of carrier 100 into a corresponding chassis cage slot, for example, cam handle 110 incorporates a latching mechanism 459, which can be configured as one or more cam latches 460. In a preferred embodiment, dual cam latches 460 are provided, with each of the latches extending generally upwardly from a sidewall 447 of the cam handle. Other aspects of the carrier configuration are described in detail in co-pending U.S. patent application Ser. No. 09/896,478, entitled "System for Mounting Data Storage Devices", filed on Jun. 29, 2001. That application is commonly assigned to the Hewlett-Packard Company and is incorporated herein by reference in its entirety.

Figure 5:
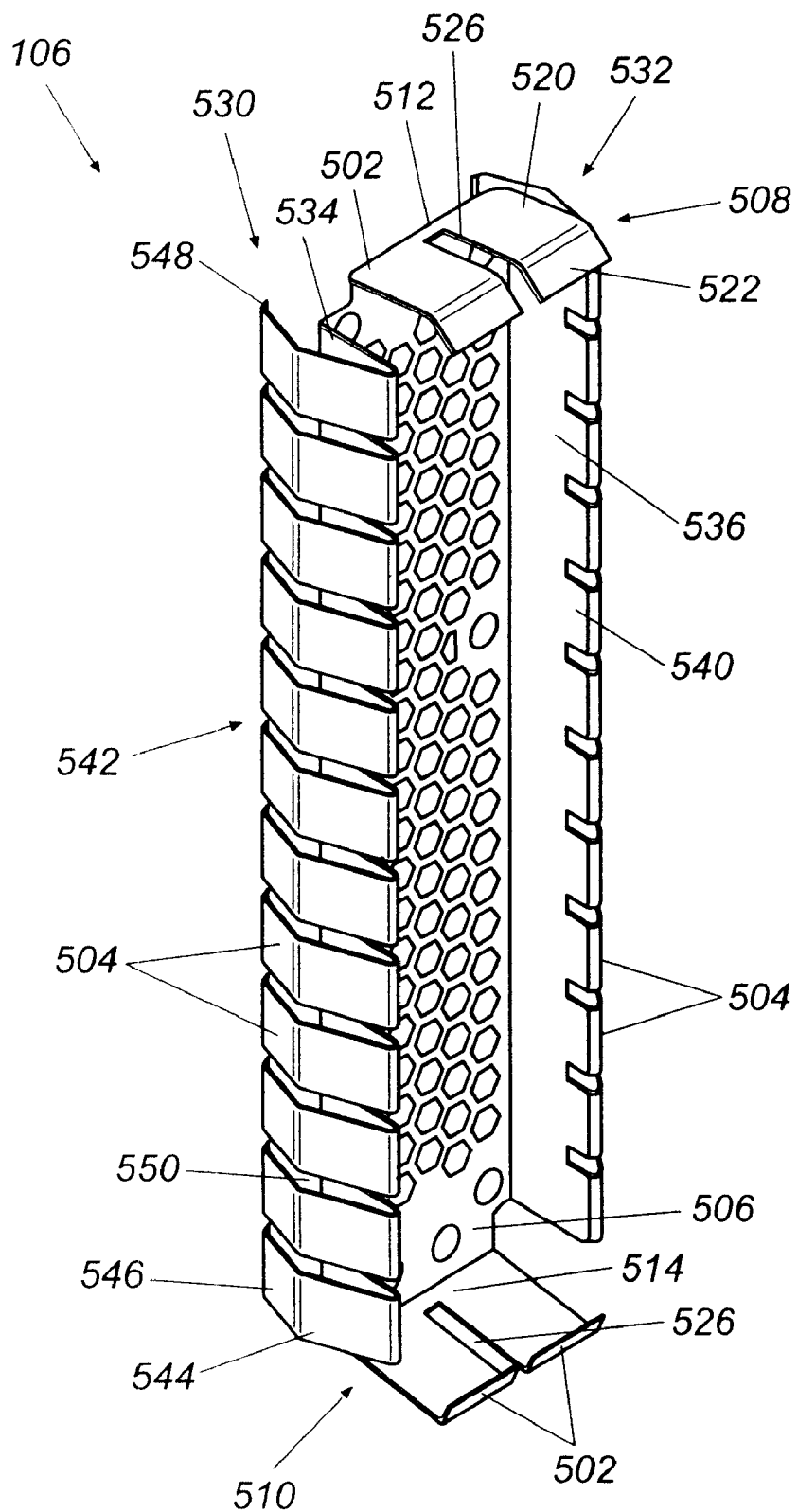
FIG. 5 is a perspective view of the shield of FIG. 4.

Referring now to FIGS. 5–8, a preferred embodiment of the shield 106 and incorporated spring fingers 80 will be described in greater detail. In FIG. 5, shield 106 includes both forward facing spring fingers 502 and rearward facing spring fingers 504 ("forward-facing" generally referring to a direction away from data storage device 412 (FIG. 4), and "rearward-facing" generally referring to a direction toward the data storage device).

In FIG. 5, the various spring fingers of shield 106 extend from the periphery of plate 506. Forward-facing spring fingers 502 are arranged in groups of fingers 508 and 510. Group 508 includes a base portion 512, which generally extends along a width of the group of spring fingers. Group 510 includes a base portion 514, which generally extends along a width of the group of spring fingers, and extends along an opposing end of plate 506 from group 508. Individual spring fingers extend from their respective bases.

Each forward-facing spring finger includes an outwardly-extending first portion 520, which extends from its base portion, and an inwardly-inclined second portion 522. More specifically, the inwardly-inclined second portion of each forward-facing spring finger is arranged at the distal end of its outwardly-extending first portion. The inwardly-inclined second portion is inclined toward plate 506 and forms an obtuse interior angle with respect to its outwardly-extending first portion.

Preferably, a 526 slot is formed between adjacently exposed ones of the forward-facing spring fingers. The slot can be appropriately sized and shaped for inhibiting propagation of electromagnetic energy beyond the material of the spring fingers. This can be accomplished by forming the aperture that defines the slot with a maximum linear dimension. The maximum linear dimension can be selected to provide a target attenuation level of the electromagnetic energy.

Rearward-facing spring fingers also are arranged in two groups, e.g., group 530 and group 532. Each group includes a base, e.g., base 534 and base 536, that generally extends a length of shield 106. Preferably, each rearward-facing spring finger includes a forward-facing portion 540 that extends from and substantially parallel to its base. A rearward-facing portion 542 engages the forward-facing portion and extends therefrom. Each rearward-facing portion 542 preferably includes a first segment 544, which forms an acute inner angle with respect to the forward-facing portion 540 and base. A second segment 546 extends from first segment 544. Second segment 546 forms an inner obtuse angle with respect to the first segment. More specifically, in some embodiments, the second segment preferably is inclined inwardly toward plate 506. A third segment 548 preferably extends from the second segment and forms an inner obtuse angle with respect to the second segment. Thus, in those embodiments including a third segment, the third segment preferably is more inwardly inclined with respect to the plate than the second segment.

A slot 550 preferably is formed between adjacent ones of the rearward-facing spring fingers. These slots also can be appropriately sized and shaped for inhibiting propagation of electromagnetic energy beyond the material of the spring fingers, as described in relation to the forward-facing spring fingers.

The double-fold configuration of the rearward-facing spring fingers enables the spring fingers to accommodate mounting of a module through a range of pitches. In particular, at one end of the range, the double-fold configuration enables the spring fingers to deflect without exceeding the tensile strength of the material of the spring fingers, i.e., when the spring fingers are oriented at their tightest pitch. At the other end of the range, the double-fold configuration enables the spring fingers to provide enough contact force for adequate electrical EMI grounding, i.e., when the spring fingers are oriented at their loosest pitch.

Spring fingers of the invention tend to deflect in response to a sufficient displacement force, such as when engaging a corresponding portion of a chassis cage slot, for example. As the spring fingers tend to be biased to their non-displaced positions (shown in FIG. 5), this configuration enables the spring fingers to serve as dampers for damping encountered shock and/or vibration of the carrier. The flexible configuration of the spring fingers also accommodates variable pitch arrangements of multiple carriers, such as shown schematically in FIGS. 1A and 1B.

Figure 9:
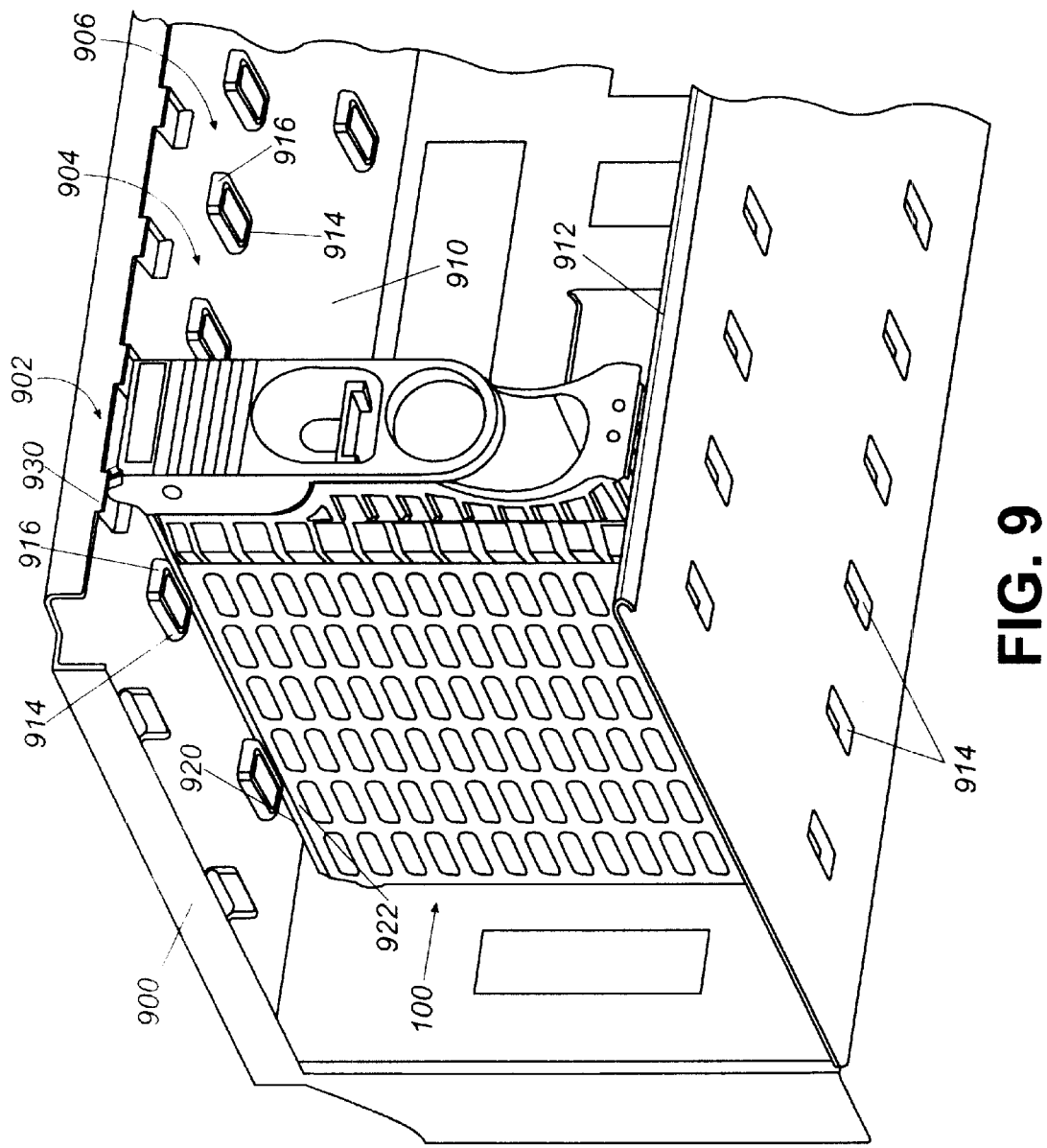
FIG. 9 is a cut-away, perspective view of a preferred embodiment of a chassis of the present invention that is configured to mount one or more modules in a vertical orientation.

Referring now to FIG. 9, mounting of a carrier 100 to a representative chassis will be described. In FIG. 9, chassis 900 defines multiple slots, e.g., slots 902, 904 and 906, each of which is configured to accommodate a carrier 100. A carrier 100 is depicted mounted within slot 902 in a vertical mounting position. Slot 902 is defined, at least in part, by an upper wall 910 and a lower wall 912. The walls are spaced from each other at a distance that is sufficient to receive carrier 100. Protrusions 914, some of which extend downwardly from upper wall 910 while others extend upwardly from lower wall 912, are configured to function as alignment guides for the carrier. These protrusions at least partially define the pitch at which carriers are arranged within the chassis.

Figure 10:
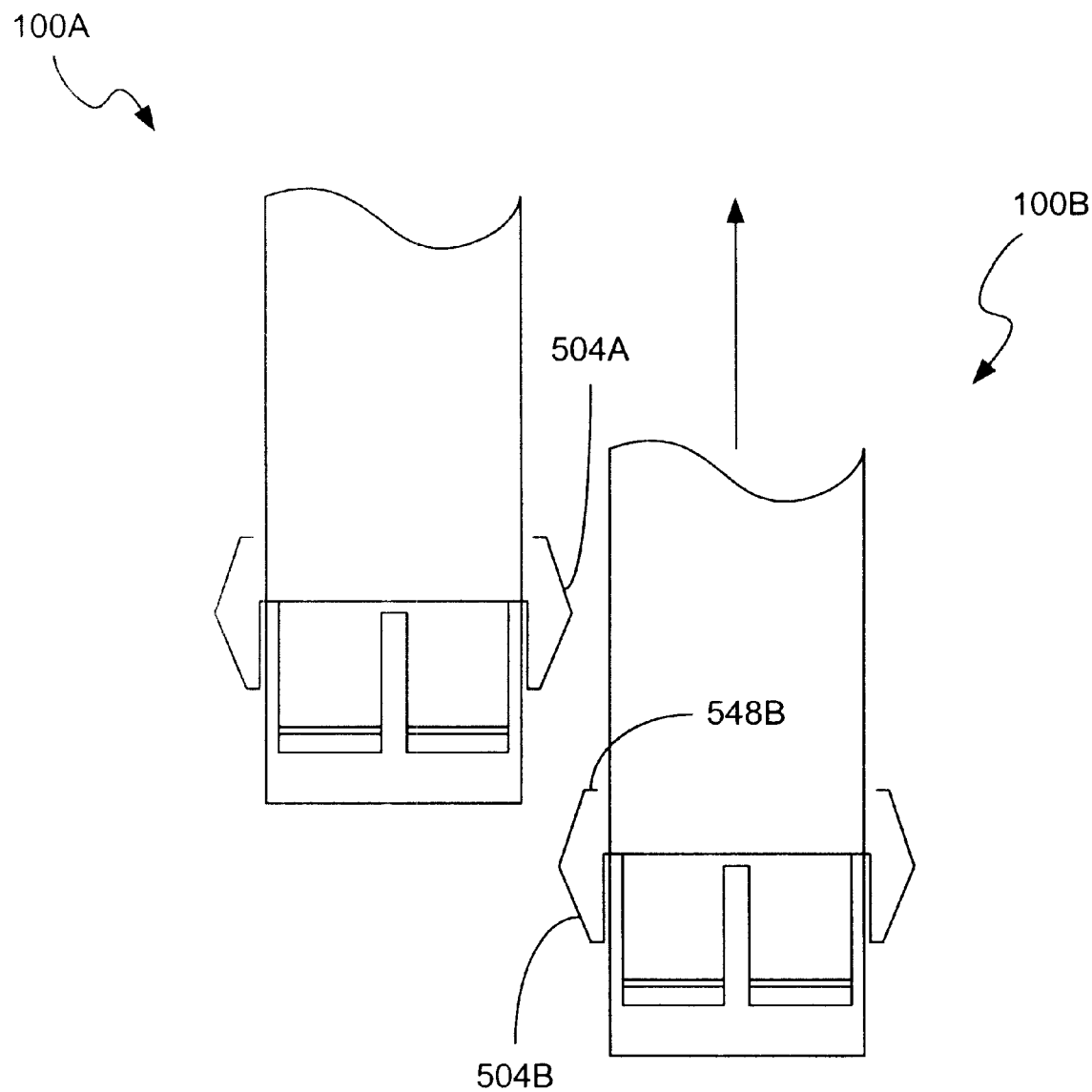
FIG. 10 is a schematic view depicting representative modules, showing detail of the spring fingers as one of the modules is being mounted adjacent to another.

In FIG. 10, two modules 100, e.g., module 100A and module 100B, are depicted. Module 100A is intended to represent a mounted module, e.g., a module mounted to chassis 900 (FIG. 9), and a module 100B is intended to represent a module that is to be mounted adjacent to module 100A. The spring fingers 504A and 504B of the modules are in their non-displaced positions. Note that, as module 100B is positioned adjacent to module 100A, third segment 548B of spring finger 504B tends to prevent module 100B from snagging on a surface of module 100A, such as spring finger 504A.

Figure 11A:
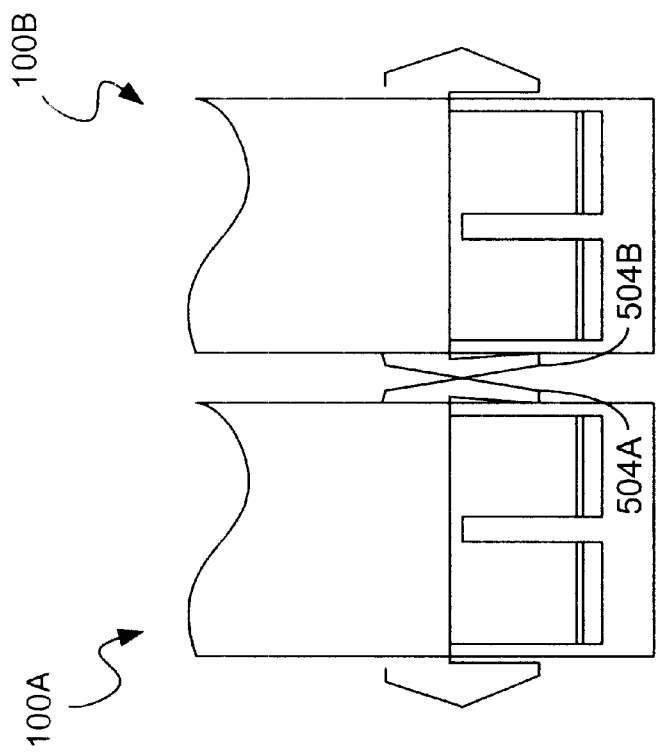
FIG. 11A is a schematic diagram depicting the modules of FIG. 10 showing adjacent spring fingers of the modules engaging each other at the highest pitch accommodated by the modules.
Figure 11B:
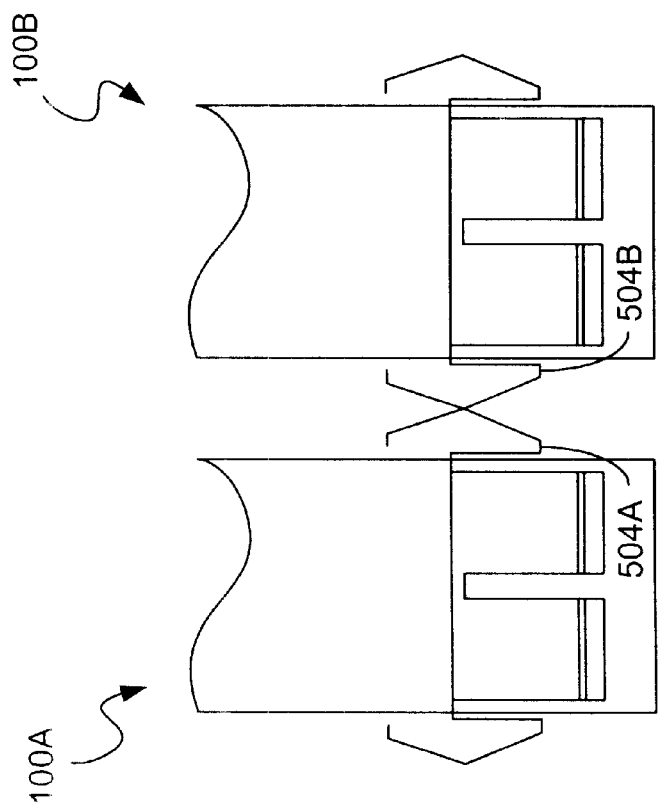
FIG. 11B is a schematic diagram depicting the modules of FIG. 10 showing adjacent spring fingers of the modules engaging each other at the lowest pitch accommodated by the modules.

Referring now to FIGS. 11A and 11B, it is shown that the spring fingers of adjacent modules can engage each other and deflect each other to accommodate a range of module pitches. For example, in FIG. 11A, each spring finger is shown slightly displaced from its non-displaced position. In this particular arrangement, the spring fingers contact each other with just enough contact force to permit adequate electrical EMI grounding between the two modules. More specifically, the spring fingers are oriented at their highest pitch. In contrast, FIG. 11B depicts the spring fingers in a highly-compressed arrangement. In the highly-compressed arrangement, the spring fingers accommodate their lowest pitch. Preferably, this arrangement does not create sufficient forces among the spring fingers to plastically deform the spring fingers and/or does not make it too difficult for a user to insert module 100B into position adjacent to module 100A.

Figure 12:
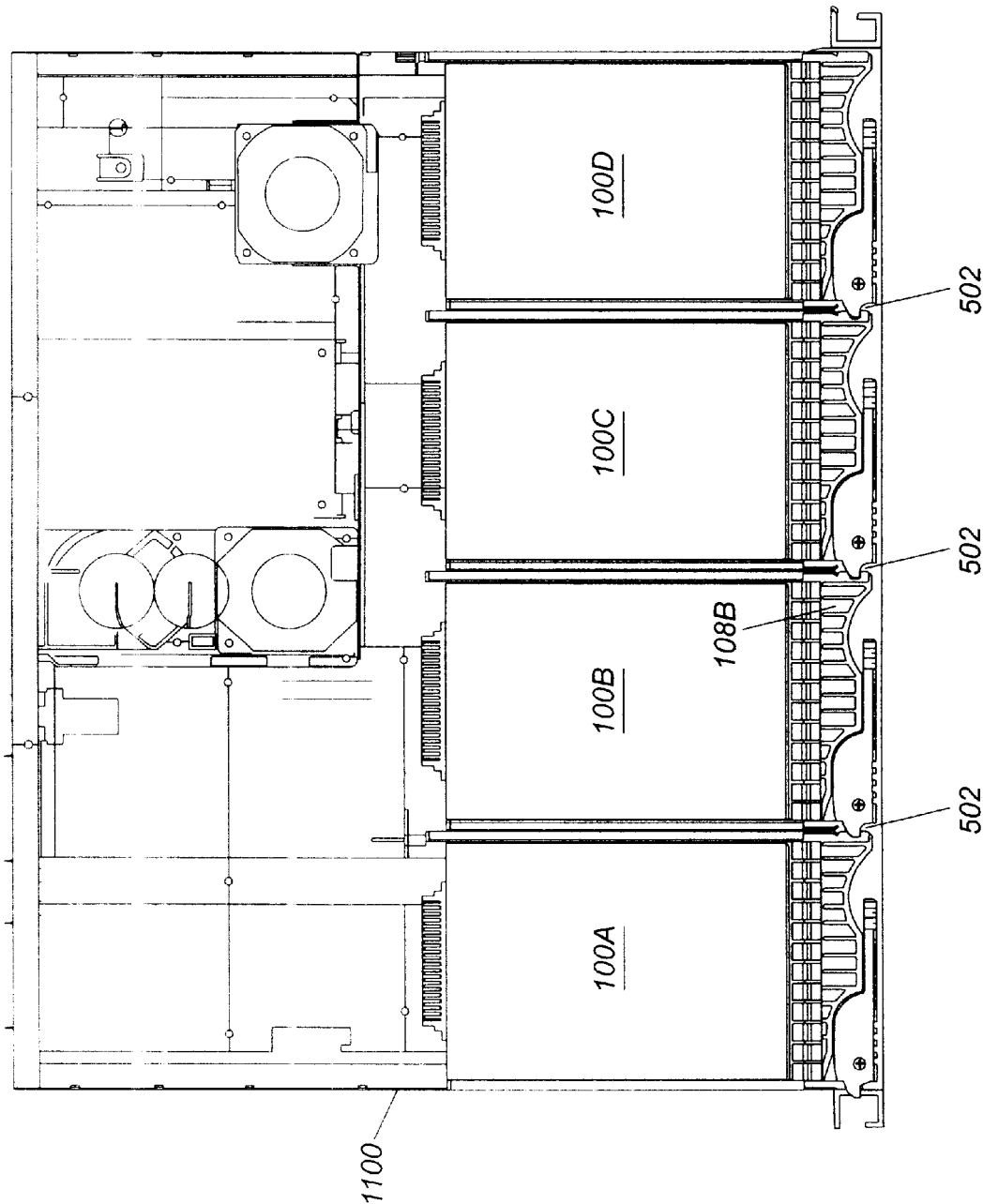
FIG. 12 is a cross-sectional, plan view of a chassis of the present invention that is configured to mount one or more modules in a horizontal orientation.

As depicted in FIG. 12, multiple carriers, e.g., carriers 100A, 100B, 100C, and 100D, can be arranged in a top-to-bottom relationship within a chassis. In this configuration, the spring fingers 502 of one module engage spring fingers 502 of an adjacent module.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A system for mounting an electronic component, said system comprising:

a module configured to mount to a chassis at a first pitch, said module including a housing and spring fingers, said housing defining an interior and being configured to mount and at least partially encase an electronic component, said spring fingers being arranged at least partially about an exterior of said housing and extending outwardly with respect to the interior said spring fingers being configured to deflect in response to a displacement force such that said module can be mounted to a first chassis accommodating the first pitch and a second chassis accommodating a second pitch, the first pitch being different than the second pitch;

wherein said spring fingers include forward-facing spring fingers and rearward-facing spring fingers, said forward-facing spring fingers generally extending in a direction away from the electronic device, said rearward-facing spring fingers generally extending in a direction toward the electronic device;

wherein said rearward-facing portion includes a first segment and a second segment, said first segment and said second engaging each other and forming an obtuse angle therebetween;

wherein said rearward-facing portion includes a third segment, said third segment extending from said second segment and being inwardly inclined with respect to said housing.

2. The system of claim 1, wherein said module has a shield engaging said housing, said shield being configured to reduce propagation of electromagnetic energy directed from the electronic component at least partially encased by said housing.

3. The system of claim 1, wherein said module has a shield and a handle assembly, said shield being at least partially disposed between said housing and said handle assembly, said shield being configured to reduce propagation of electromagnetic energy directed from the electronic component at least partially encased by said housing, said handle assembly being configured to enable moving of said module relative to the chassis.

4. The system of claim 1, further comprising:

means for reducing propagation of electromagnetic energy directed from the electronic component at least partially encased by said housing.

5. The system of claim 1, wherein said spring fingers are arranged in a spaced configuration such that adjacently disposed ones of said spring fingers form a slot therebetween.

6. The system of claim 1, wherein said spring fingers are arranged about a periphery of said housing.

7. The system of claim 1, further comprising:

a chassis configured to mount said module, said chassis defining a plurality of slots, said module being configured to engage within a corresponding one of said slots and seal a gap formed between said module and said chassis such that said spring fingers facilitate electromagnetic compatibility of said module and said chassis.

8. The system of claim 1, further comprising: an electronic component at least partially encased by said housing.

9. The system of claim 8, wherein said electronic component is a disk drive.

10. The system of claim 1, wherein said one of said rearward-facing spring fingers has a forward-facing portion and a rearward-facing portion, said forward-facing portion having a first end and a second end, said first end of said forward-facing portion being fixed in position relative to said housing, said rearward-facing portion having a first end and a second end, said first end of said rearward-facing portion engaging said second end of said forward-facing portion, said second end of said rearward-facing portion being free-floating relative to said housing.

11. The system of claim 10, wherein said rearward-facing portion comprises:

means for preventing snagging of said spring finger.

12. The system of claim 10, wherein said second end of said rearward-facing portion includes a segment, said segment being inwardly inclined with respect to said housing.

13. A system for mounting an electronic component to chassis, said system comprising:

a first module having a housing and spring fingers, said housing being configured to mount and at least partially encase an electronic component, said spring fingers being arranged at least partially about an exterior of said housing and extending outwardly therefrom, each of said spring fingers having a first portion and a second portion, said first portion having a first end fixed in position relative to said housing, said second portion being attached to and at least partially overlying said first portion, said second portion having a first end moveable relative to said housing; and a second module, said spring fingers of said first module being configured to deflect in response to contacting said second module such that said first module and said second module can be alternately mounted to chassis at a first pitch and a second pitch, the first pitch being different than the second pitch;

a first chassis configured to mount said first module and said second module at the first pitch, said chassis defining a plurality of slots, said first module and said second module each being configured to engage within a corresponding one of said slots such that said first module and said second module are mounted to said first chassis adjacent to each other, at least some of said spring fingers of each of said modules electrically engaging said first chassis and each other such that said first module and said second module are commonly grounded; and a second chassis configured to mount said first module and said second module at the second pitch, said second chassis defining a plurality of slots, said first module and said second module each being configured to engage within a corresponding one of said slots of said second chassis such that said first module and said second module are mounted to said second chassis adjacent to each other, at least some of said spring fingers of each of said modules electrically engaging said second chassis and each other such that said first module and said second module are commonly grounded.

14. The system of claim 13, wherein said spring fingers of said first module are arranged about a periphery of said housing of said first module in a spaced configuration such that adjacently disposed ones of said spring fingers form a slot therebetween.

15. The system of claim 13, wherein said spring fingers of said first module and said spring fingers of said second module are configured such that mounting of said first module and said second module to said first chassis at the first pitch and to said second chassis at the second pitch can be accomplished without plastically deforming said spring fingers.

* * * * *